United States Patent

Higgins, III

[19]

[11] Patent Number: 6,064,114
[45] Date of Patent: May 16, 2000

[54] SEMICONDUCTOR DEVICE HAVING A SUB-CHIP-SCALE PACKAGE STRUCTURE AND METHOD FOR FORMING SAME

[75] Inventor: Leo M. Higgins, III, Austin, Tex.

[73] Assignee: Motorola, Inc., Schaumburg, Ill.

[21] Appl. No.: 08/980,783

[22] Filed: Dec. 1, 1997

[51] Int. Cl.⁷ .................................................. H01L 23/04
[52] U.S. Cl. .......................................... 257/698; 257/778
[58] Field of Search .................................... 257/782, 783, 257/778, 777, 685, 686, 786, 785

[56] References Cited

U.S. PATENT DOCUMENTS

| | | | |
|---|---|---|---|
| 5,148,265 | 9/1992 | Khandros et al. | 357/80 |
| 5,148,266 | 9/1992 | Khandros et al. | 357/80 |
| 5,757,078 | 5/1998 | Matsuda et al. | 257/778 |
| 5,847,936 | 2/1999 | Forehand et al. . | |
| 5,866,939 | 2/1999 | Shin et al. . | |
| 5,866,943 | 2/1999 | Mertol . | |
| 5,898,223 | 4/1999 | Frye et al. | 257/778 |
| 5,939,783 | 8/1999 | Laine et al. . | |
| 5,986,338 | 11/1999 | Nakiajima . | |

OTHER PUBLICATIONS

Steve Greathouse, Intel Corp. Chandler, Az, Chip Scale Packaging Breaks New Frontiers, reprinted from Mar. 1996 edition of Solid State Technology & European Semiconductor.

Masatoshi Yasunaga et al., Chip Scale Package: "A Lightly Dressed LSI Chip", From IEEE Transactions on Components, Packaging, & Manufacturing Technology, Pt 1, vol. 18, No. 3, Sep. 1995.

J. Simon et al., A Critical Review of Chip Scale Packaging, Chipcon '97, Semiconductor Technology Center, Inc.

Tessera New s, vol. 2, No. 6, Intel Selects Tessera's uBGA tm Package for Flash Memory Devices.

Tessera uBGA, Breakthrough I Chip Packaging.

Thomas DiStefano, et al. A Compliant Chip–Size Packaging Technology.

Joseph Fjelstad et al., Flex–On–Chip, reprinted from Surface Mount Technology Magazine Aug. 1995.

Glenda Derman, Chip–Size Packages Proliferate, Electronic Engineering Times, Dec. 15, 1995.

Thomas Distefano, Interconnects & Packaging, Building on the Surface–Mount Infrastructure, Electronic Engineering Times, Feb. 26, 1996.

Ashok Bindra, Chip–Scale Packages Poised for Growth, Electronic Engineering Times, Aug. 18, 1995.

*Primary Examiner*—Sheila V. Clark

[57] ABSTRACT

A semiconductor device (1) has a sub-chip-scale package structure, wherein the substrate (50) has at least one of an X dimension and a Y dimension smaller than a corresponding dimension of the semiconductor die (10). The semiconductor device (1) has a plurality of electrical connections between the semiconductor die and the substrate, the electrical connections (15, 20) being provided within the outer periphery of the substrate. The semiconductor device (1) permits packaging of semiconductor die (10) at the wafer level, that is, before the semiconductor die are singulated.

20 Claims, 3 Drawing Sheets

6,064,114

SEMICONDUCTOR DEVICE HAVING A SUB-CHIP-SCALE PACKAGE STRUCTURE AND METHOD FOR FORMING SAME

FIELD OF THE INVENTION

The present invention is drawn to a packaged semiconductor device and method for packaging a semiconductor device. More particularly, the present invention is directed to chip-scale type packages.

BACKGROUND OF THE INVENTION

Chip-scale packages (CSPs) are of current interest in modern semiconductor packaging. The chip-scale package is a relatively new packaging technology, in which a semiconductor die is bonded to a substrate, such as plastic or ceramic, and the substrate is about the same size as the semiconductor die, or more specifically, slightly larger than the semiconductor die. The current focus on chip-scale packages is primarily due to the reduced footprint that such packages provide, which enables the final assembler of an electronic device to improve functionality of the device by incorporating a maximum number of semiconductor devices in a given space.

According to the state of the art, chip-scale packages are relatively costly and have numerous reliability issues, primarily due to the relative complexity of such packages. In addition, the reliability of chip-scale packages, as well as any packaged semiconductor device, is directly proportional to the size of the die. As semiconductor manufacturers incorporate more functionality into a single die, the die size increases absent enabling technology to reduce the feature sizes of the die. As die sizes increase, the reliability of the interconnects between the semiconductor die and the substrate (i.e., first level packaging interconnects) becomes more suspect. In addition, as the size of the packaged semiconductor device increases (thereby increasing footprint size), the reliability of the interconnects between the packaged semiconductor device and the printed circuit board (i.e., second level packaging interconnects) becomes more of a concern. Such reliability problems are primarily due to the differences in thermal expansion coefficients between the materials of the semiconductor die, the substrate, and the printed circuit board, which differences result in stress on the interconnects during changes in ambient temperature and power cycling.

In addition to the issues of decreasing package size and maintaining reliability, there has been an increase in interest in wafer level packaging, that is, packaging semiconductor die in that are in wafer form, before being singulated. It is thought that wafer level packaging may improve reliability and decrease costs by reducing the number of individual components that must be handled by automated machinery. However, a low cost method utilizing conventional packaging technologies to produce a chip-scale package that reliably decouples the thermal expansion mismatch stress between the semiconductor die and the package substrate while assuring BGA (ball grid array) reliability has not yet been developed to enable wafer level packaging.

Accordingly, a need exists in the art for improved chip-scale packages that use standard assembly equipment, are less costly have high reliability and which may permit wafer level packaging

BRIEF DESCRIPTION OF THE DRAWINGS

A better understanding of the present invention can be obtained when the following detailed description is considered in conjunction with the following drawings, in which.

Figure 1:
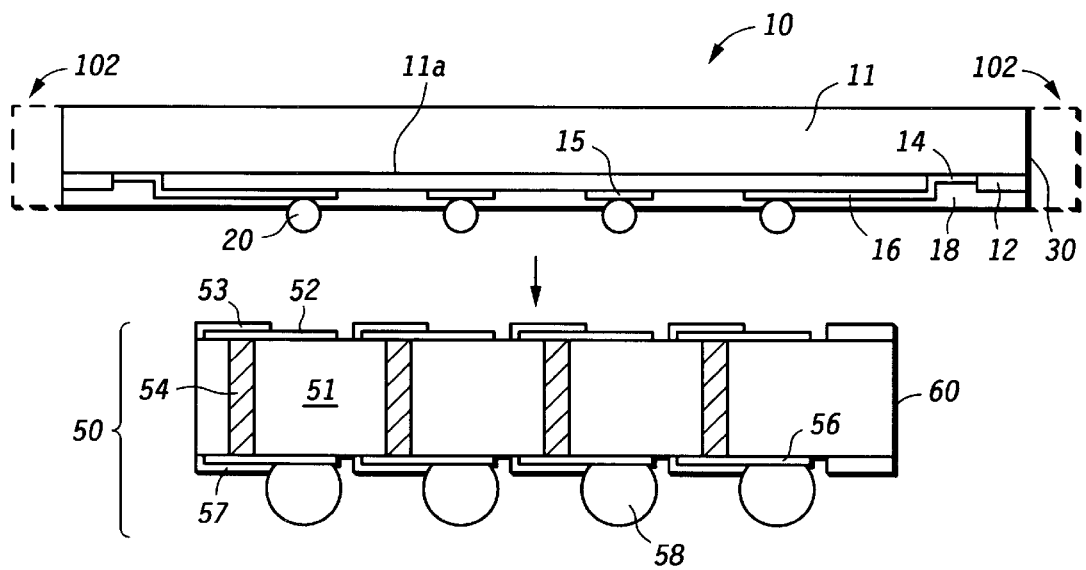
FIGS. 1 and 2 illustrate an embodiment of the present invention wherein a die is joined to a substrate and underfilled with an underfill encapsulation layer.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION OF THE DRAWINGS

As shown in FIG. 1, a semiconductor die 10 is provided, including an active portion 11 and an interlevel dielectric (ILD) layer 12 on active portion 11 which is patterned so as to provide for formation of circuit contact pads 14, arranged adjacent a die outer periphery 30. It is noted that the active portion 11 includes a silicon substrate, on which are formed active devices to define active surface 11a, the active surface 11a being interconnected by higher level metal layers (not shown), as is well known in the art. As understood in the art, higher level metal layers are referred to as M1 (metal layer one) through, for example, M6 (metal layer six). The details of the active portion 11 are understood by one of ordinary skill in the art and are not particularly important for a complete understanding of the present invention. Redistribution traces 16 are connected to the circuit contact pads 14, to route electrical connection in an inward direction toward a central portion of the semiconductor die. As shown, the redistribution traces 16 terminate at under bump metallization (UBM) pads 15. Thereafter, a passivation layer 18 is deposited and patterned to leave openings above the UBM pads 15, and solder bumps 20 are formed respectively on the UBM pads 15.

According to the semiconductor die 10 described above, solder bumps 20 are electrically connected to the active surface of the semiconductor die 10. As is known in the art, the semiconductor die 10 shown in FIG. 1 is considered "bumped." The bumped die is flipped such that the active surface is facing downward (as shown) for subsequent bonding to a substrate. The solder bumps may be formed according to the known Controlled Collapse Chip Connection (C4) technology or may be formed by alternative bumping techniques (i.e., stencil printing or solder jet application). Further, a dicing street 102 is depicted along the die outer periphery 30, which is described in more detail below with respect to FIG. 3. The ILD layer 12 may be formed of any appropriate dielectric material, such as silicon dioxide, silicon nitride, silicon oxynitride, polyimide, etc. The passivation layer 18 is provided for protection of the active surface, and may take the form of a composite structure including phosphosilicate glass, silicon nitride, polyimide layers, etc. Further, to clarify nomenclature used in connection with FIG. 1, the solder bumps 20 in combination with UBM pads 15 are together generally referred to as electrical contacts, formed on a surface of the semiconductor die. It is well understood that such electrical contacts may be embodied in other forms. For example, solder bumps 20 may be replaced with other metal bumps such as gold wire stud bumps and electroless nickel/gold plated bumps, or conductive polymer bumps. The electrical contacts may also be embodied as unbumped metal pads that are layered with a polymer layer containing a conductive component, such as nickel powder or gold plated polymer beads, dispersed in a thermosetting or thermoplastic film or paste. As is known in the art, electrical connection is executed by applying pressure between the semiconductor die and the substrate so as to leave a thin layer of the conductive component between the unbumped metal contact pads and conjugate traces (e.g., direct chip attach (DCA) bond pads) on the substrate. This type of polymer material is generally referred to as an anisotropic conductive adhesive. This adhesive may also be used with the above-mentioned gold wire stud bumps, and electroless nickel/gold bumps, and similar structures.

Figure 2:
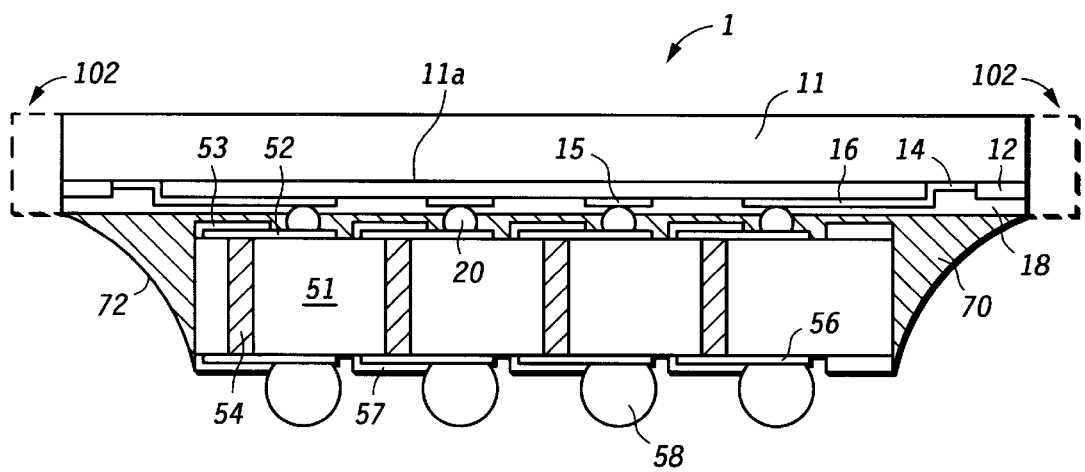

Turning to the substrate 50 in FIGS. 1 and 2, a structure is shown including an insulating layer 51, preferably formed of an organic polymer. However, insulating layer 51 may also be formed of an insulating ceramic material as is known in the art, as well as a metal layer having insulating films formed on opposing surfaces and through vias extending therethrough. According to one embodiment of the present invention, the organic polymer forming insulating layer 51 may be composed of a polyimide flexible circuit, or a fiberglass reinforced epoxy laminate. Organic reinforcements such as aramid fibers may also be utilized in place of the fiberglass component. As shown in FIG. 1, on a first surface (i.e., top surface) of the insulating layer 51, a plurality of direct chip attach (DCA) bond pads 52 are formed, that respectively line-up with the solder bumps 20 of the semiconductor die 10. A solder mask 53 is provided to prevent unwanted flow of the solder material comprising solder bumps 20 during a reflow step to effect joining between the substrate 50 and the semiconductor die 10. As shown, a plurality of electrical interconnections in the form of vias 54, or plated through holes, connect the DCA bond pads 52 to ball grid array (BGA) bond pads 56 provided on a second, bottom surface of the substrate. A second solder mask 57 is provided on the BGA bond pads 56, on which are formed ball grid array (BGA) balls 58, generally formed of a solder material. Reference numeral 60 depicts an outer peripheral surface of the substrate. As used herein, the term "substrate" refers to a mechanical component which carries the semiconductor die and which has (i.e., supports) electrical connection elements (here, elements 52, 54, 56, and 58) to provide electrical connection from the semiconductor die to the next level of interconnection, such as through a printed circuit board.

Turning to FIG. 2, a completed, packaged semiconductor device 1 is shown, wherein the substrate 50 is joined to semiconductor die 10. The substrate 50 is placed on the semiconductor die 10 and an underfill encapsulation layer 70 is provided between the semiconductor die 10 and the substrate 50. The underfill encapsulation layer includes a fillet 72 that spans the active surface of the semiconductor die exposed by the substrate, and the substrate outer peripheral surface 60. The fillet is formed by the wetting action of the material of underfill encapsulation layer 70, along the substrate outer peripheral surface 60. The electrical connection is effected concurrently with the formation of the underfill encapsulation layer 70, or may be effected prior to the formation of the underfill encapsulation layer 70, such as by reflow. The material of the underfill encapsulation layer is generally formed of a spherical fused silica particle-filled epoxy resin, which is cured by conventional techniques (e.g., heating). The underfill encapsulation layer 70 may be deposited by any one of known techniques, such as by depositing the material around at least one edge of the die and relying upon capillary action for the material to be pulled into the interface between the semiconductor die 10 and the substrate 50.

Further, all of the plurality of electrical contacts (i.e., solder bumps 20 and UBM pads 15) are located within the outer periphery of the substrate 50. This particular feature of the invention is advantageous in isolating all electrical connections from the environment external to the packaged semiconductor device. In addition, the present invention permits array bonding between the semiconductor die and the substrate in a CSP rather than peripheral bonding. Furthermore, the array bonding according to the present invention permits a relatively large size differential between the semiconductor die and the substrate, over known CSPs that use peripheral bonding. In such known CSPs, a reduction in the size of the substrate results in unusually long bonding leads between the die and the substrate. Such long bonding leads lack the thermal stability of the relatively short bonding leads used in current peripheral bonding-type CSPs, and may be more readily damaged.

While in the embodiment shown in FIGS. 1 and 2, the BGA balls 58 are provided on the substrate 50 prior to attachment to the semiconductor die 10, it is understood that the BGA balls 58 may be attached to the substrate 50 following attachment to the semiconductor die 10 either in the preferred wafer format or after die singulation. According to the embodiment shown in FIGS. 1 and 2, solder bumps 20 are utilized to effect electrical interconnection between the substrate 50 and the semiconductor die 10, followed by underfilling with the underfill encapsulation material. The underfill encapsulation may be formed at the same time as electrical connection. In this embodiment, a material forming the underfill encapsulation layer 70 is first deposited on the semiconductor die, followed by placement of the substrate thereon. In subsequent processes, the electrical interconnect between the bumps 20 and the DCA bond pads 52 (e.g., by reflow), and the attachment of the underfill encapsulation layer 70 is accomplished (e.g., by curing). The reflow and curing may be carried out simultaneously.

Figure 3:
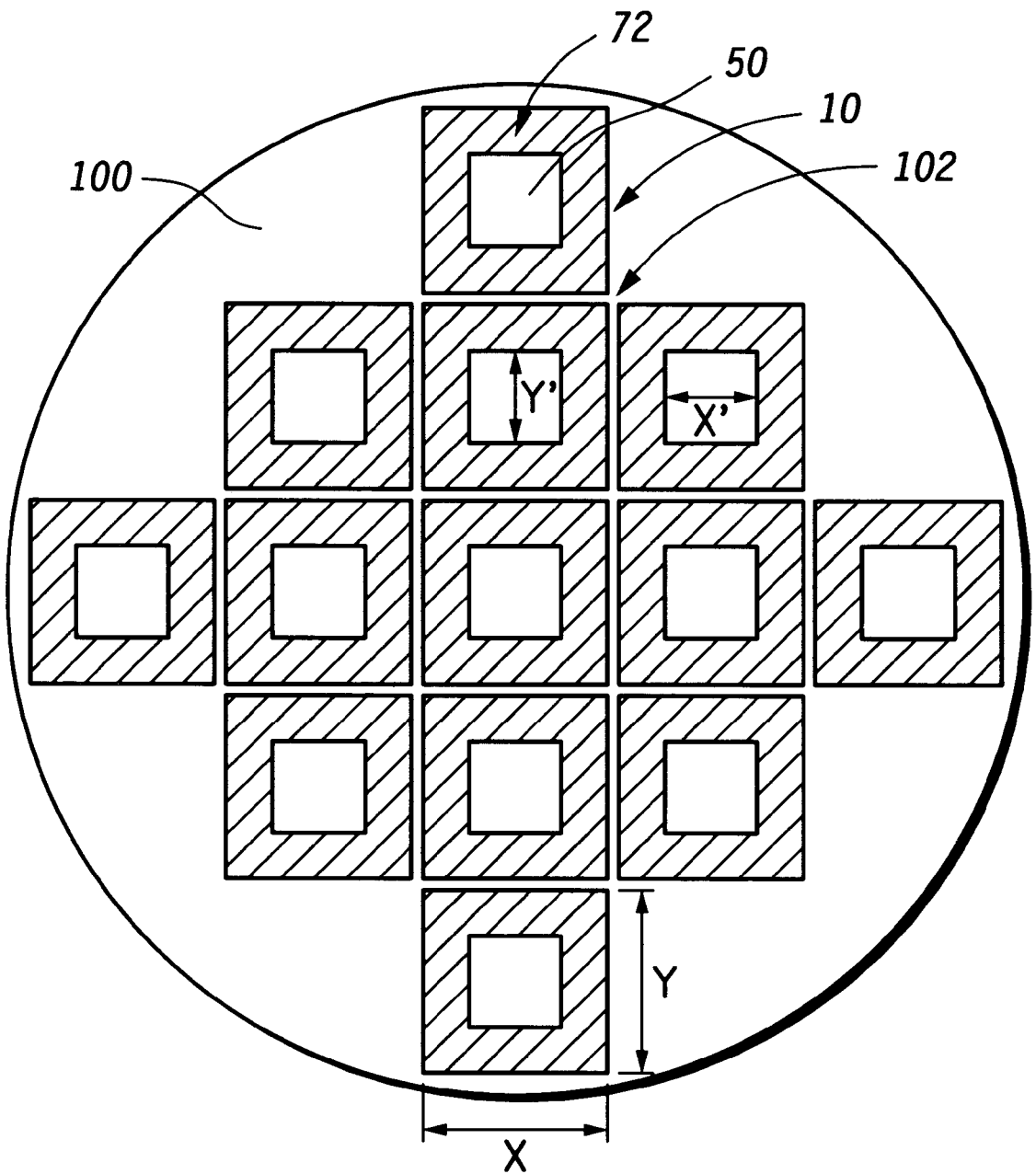
FIG. 3 illustrates, in a plan view, an embodiment of the present invention wherein a plurality of die are simultaneously packaged on a wafer level scale.

Turning to FIG. 3, a plan view of packaging a plurality of semiconductor die in wafer form is shown. As shown, a plurality of semiconductor die (thirteen in this embodiment) are packaged simultaneously. Dimensions X' and Y' of the substrate, as well as dimensions X and Y of the semiconductor die, are perpendicular to each other. Here, it is shown that both (i) the X' dimension of the substrate is smaller than the X dimension of the semiconductor die, and (ii) the Y' dimension of the substrate is smaller than the Y dimension of the semiconductor die. However, it is noted that according to the present invention, one or the other of dimensions X' and Y' may be made smaller than a corresponding dimension X or Y of the semiconductor die. In this embodiment, during die singulation along dicing streets 102, the substrate edge extending beyond the edge of the die 10 will be concurrently cut leaving the die edge in alignment with the edge of the substrate. However, it is preferable that both dimensions X' and Y' are made smaller than dimensions X and Y of the semiconductor die As shown in FIG. 3, the semiconductor wafer 100 has dicing streets 102 that separate the individual die from each other. The material along dicing streets 102 is substantially removed, as shown in FIGS. 1 and 2 by the dotted lines.

Figure 4:
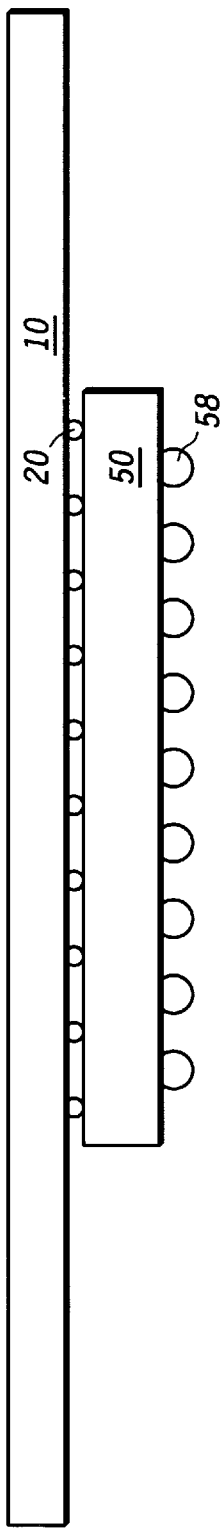
FIGS. 4, 5 and 6 illustrate alternative embodiments of the present invention depicting relative semiconductor die/substrate size differences.
Figure 5:
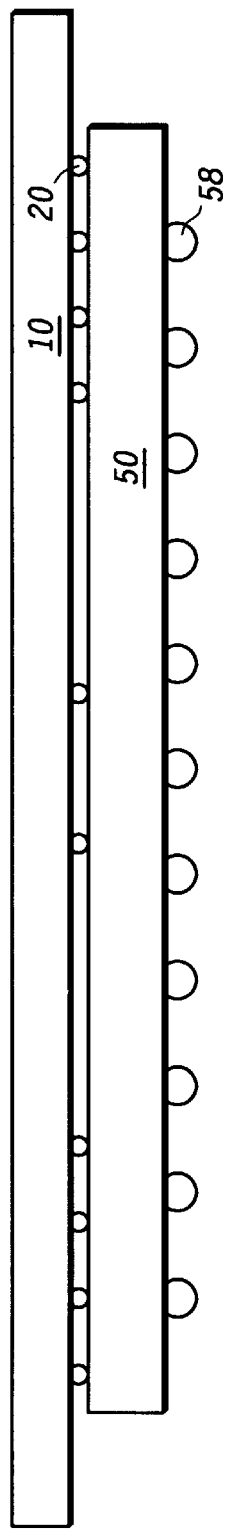
Figure 6:
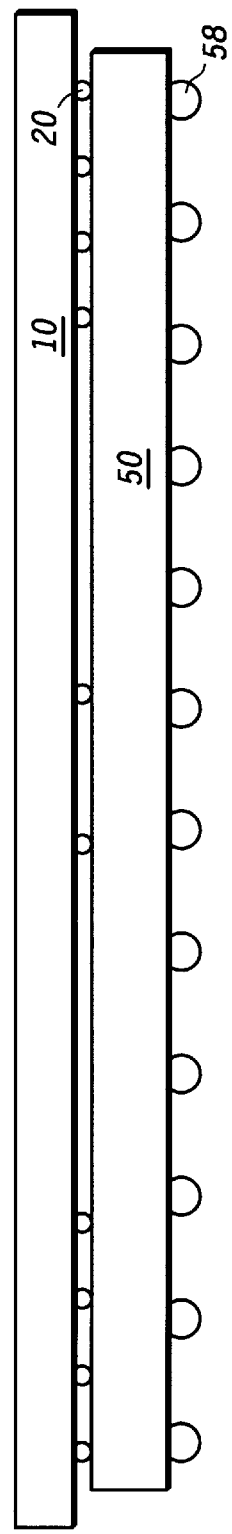

FIGS. 4, 5 and 6 illustrate alternative embodiments of the present invention, somewhat similar to the embodiment described above with respect to FIGS. 1–3. In FIGS. 4–6, semiconductor die 10 is 10 mm square, has a thickness of 0.4 mm, and has one-hundred electrical contacts. The substrate is 0.5 mm in thickness. Although FIGS. 4–6 depict an essentially identical semiconductor die 10, three different redistribution schemes are shown.

First, in FIG. 4, a relatively aggressive redistribution scheme is shown wherein eighty-one BGA balls 58 are arranged at a 0.5 mm pitch on a 5 mm square substrate. FIG. 5 illustrates one-hundred twenty BGA balls 58 arranged at a 0.65 mm pitch on a 7.5 mm square substrate. Lastly, FIG. 6 illustrates one-hundred forty-four BGA balls 58 arranged at a 0.80 mm pitch on a 9.5 mm square substrate. According to FIG. 4, the relatively aggressive redistribution scheme is shown and may be advantageous from the standpoint of minimizing the footprint of the substrate 50. Minimization of the footprint of substrate 50 results in an improvement in the reliability in connection between the substrate 50 and the printed circuit board to which it is attached. As shown, that portion of the semiconductor die 10 that extends beyond and surrounds the substrate 50 does not contribute significantly to stress on the joints defined by the BGA balls to the circuit board (not shown), which stress is due to thermal expansion coefficient mismatch. This die region extending beyond the edge of the substrate 50 is only thermo-mechanically coupled to the substrate 50 by the fillet 72 of the underfill encapsulation layer 70 shown in FIG. 3. Despite this advantage, assuming that circuit contact pads are formed adjacent the outer periphery of the semiconductor die 10, as in the embodiment shown in connection with FIGS. 1–2, a relatively long redistribution net is required that might induce undesirable parasitic losses, and might have a negative impact on heat transfer from the semiconductor die 10 to the substrate 50. It is also noted that the pin count is reduced from one-hundred electrical contacts (between the die and substrate) to eighty-one contacts. Such a decrease in number of electrical contacts is achieved through the use of common power and ground planes, or plane segments, in the substrate.

In view of the relative design constraints associated with the aggressive redistribution scheme shown in FIG. 1, higher frequency and/or higher powered devices may require less aggressive redistribution schemes as shown in FIGS. 5 and 6. As shown, FIGS. 5 and 6 provide an increase in number of BGA balls that improve electrical performance and power dissipation. It is noted that all embodiments are compatible with state of the art heat sinks, such as those that may be attached to the inactive surface of the semiconductor die 10.

As discussed above, it is quite clear that the present invention provides an improved sub-chip-scale package that addresses several of the needs according to the state of the art. According to the present invention, not only is the interconnection reliability between the die and the substrate improved, but also the interconnection reliability between the substrate and the printed circuit board, by decreasing the footprint of the substrate. In this regard, unlike true chip-scale packages, wherein the substrate is the same size as the semiconductor die, the present invention provides for formation of an underfill encapsulant fillet which coats the region of the die extending beyond the substrate edge instead of the segment of the substrate which would overlie the die in this region in a typical CSP. This has been shown to be effective in mitigating stresses due to thermal expansion coefficient mismatch between the substrate and the die. In addition, unlike current state of the art chip-scale packages, the present invention is relatively cost effective to manufacture and implement, due to the relatively straight-forward structure disclosed herein. Furthermore, the invention provides a means to reduce substrate cost by approximately 40 to 80% due to substrate size reduction. Moreover, the present invention requires no additional or further equipment expenditure by semiconductor manufacturers, as conventional flip-chip packaging equipment may be incorporated to form packaged semiconductor devices according to the teachings of the present invention. And, the present invention enables wafer level packaging, whereby all semiconductor die on a wafer may be simultaneously packaged.

Further, the present invention provides increased throughput with higher yield during the packaging operation. Specifically, unlike the prior art, the substrates according to an embodiment of the present invention are placed on semiconductor die before singulation, in wafer form. Due to the precision with which the semiconductor die are formed on a wafer, very highly accurate fiducials may be formed globally on the wafer, which have essentially exact relationships with respect to the die on the wafer. An appropriate imaging system may detect the global fiducials on the wafer, thereby providing for very precise placement of the substrate on a particular die by use of only the global fiducials. In contrast, according to the prior art, a printed circuit board which is to be singulated into a plurality of substrates is provided, on which the singulated die are attached. However, according to the prior art, the printed circuit board is made with relatively low precision global fiducials, which cannot provide the degree of alignment as provided by the global fiducials on a wafer according to the present invention. This reduces production throughput since the vision system must locate both the die and the local fiducials on the substrate.

It is noted that variations may be made to the present invention without departing from the spirit and scope of the present invention as defined in the appended claims. For example, although not shown in the drawings, the substrates may be connected together in the form of a single sheet, or several multi-unit segments, which are then overlaid upon a whole wafer. Subsequent dicing would serve to separate the substrates from each other. The use of single substrates is preferred since it eliminates the waste and cost of substrates placed on the previously probe-tested wafer.

What is claimed is:

1. A semiconductor device, comprising:
   a semiconductor die having a surface, and outer periphery X and outer periphery Y dimensions, the outer periphery X and outer periphery Y dimensions of the semiconductor die being perpendicular to each other;
   a plurality of electrical contacts on the surface of the semiconductor die; and
   a package substrate overlying the semiconductor die and being electrically connected to the plurality of electrical contacts, wherein: the package substrate has outer periphery X' and outer periphery Y' dimensions being perpendicular to each other, at least one of (i) the outer periphery X' dimension of the package substrate is less than the outer periphery X dimension of the semiconductor die, and (ii) the outer periphery Y' dimension of the package substrate is less than the outer periphery Y dimension of the semiconductor die, and the plurality of electrical contacts are located within the outer periphery X dimension and the outer periphery Y dimension of the package substrate.

2. The semiconductor device of claim 1, wherein both (i) the outer periphery X' dimension of the package substrate is less than the outer periphery X dimension of the semiconductor die, and (ii) the outer periphery Y' dimension of the package substrate is less than the outer periphery Y dimension of the semiconductor die.

3. The semiconductor device of claim 1, further comprising an underfill encapsulation layer between the semiconductor die and the package substrate.

4. The semiconductor device of claim 3, wherein the package substrate has an outer peripheral surface, and the underfill encapsulation layer forms a fillet extending along the outer peripheral surface of the package substrate.

5. The semiconductor device of claim 1, wherein the plurality of electrical contacts comprises metal bumps.

6. The semiconductor device of claim 5, wherein the plurality of metal bumps comprises solder.

7. The semiconductor device of claim 1, wherein the package substrate includes an insulating layer having a first surface and a second surface opposite the first surface, a plurality of direct chip attach bond pads on the first surface, a plurality of ball grid array bond pads on the second surface, a plurality of electrical interconnections that interconnect the plurality of direct chip attach bond pads to the plurality of ball grid array bond pads, and a plurality of ball grid array balls respectively attached to the plurality of ball grid array bond pads.

8. The semiconductor device of claim 7, wherein the plurality of electrical interconnections extends through the package substrate.

9. The semiconductor device of claim 1, wherein the semiconductor die has an outer periphery, the semiconductor die further comprising a plurality of circuit contact pads arranged adjacent the outer periphery and a plurality of redistribution traces extending from the plurality of circuit contact pads toward a central portion of the semiconductor die.

10. The semiconductor device of claim 1, wherein the package substrate includes an insulating layer, the insulating layer comprising a material from a group consisting of organic polymer and ceramic.

11. The semiconductor device of claim 10, wherein said material is an organic polymer.

12. A semiconductor device, comprising:
a semiconductor die having a surface, and X and Y dimensions, the X and Y dimensions of the semiconductor die being perpendicular to each other;
a plurality of electrical contacts on the surface of the semiconductor die; and
a substrate having a plurality of electrical connections between conductive portions of a first outer surface and conductive portions of a second outer surface, the first outer surface is between and adjacent to the second outer surface and the surface of the semiconductor die, wherein one of the plurality of electrical connections of the substrate is electrically connected to at least one of the plurality of electrical contacts on the surface of the semiconductor die, wherein the first outer surface of the substrate has X' and Y' dimensions being perpendicular to each other, and at least one of (i) the X' dimension of the first outer surface substrate is less than the X dimension of the semiconductor die, and (ii) the Y' dimension of the first outer surface substrate is less than the Y dimension of the semiconductor die, furthermore, the substrate has an outer periphery, and the plurality of electrical contacts are located within the outer periphery of the substrate.

13. The semiconductor device of claim 12, wherein the plurality of electrical contacts comprises metal bumps.

14. The semiconductor device of claim 13, wherein the plurality of metal bumps comprises solder.

15. The semiconductor device of claim 12, further comprising an underfill encapsulation layer between the semiconductor die and the substrate.

16. The semiconductor device of claim 15, wherein both (i) the X' dimension of the substrate is less than the X dimension of the semiconductor die, and (ii) the Y' dimension of the substrate is less than the Y dimension of the semiconductor die.

17. The semiconductor device of claim 15, wherein the substrate has an outer peripheral surface, and the underfill encapsulation layer forms a fillet extending along the outer peripheral surface of the substrate.

18. A semiconductor device comprising:
first cross-sectional component along a first line perpendicular the surface of the device and a second cross-sectional component along a second line perpendicular the surface of the device,
from the first surface to the second surface, the first cross sectional component including the following layers
a first conductive pad;
an insulator;
an encapsulation material; and
a semiconductor die;
from the first surface to the second surface, the second cross sectional component including the following layers
the encapsulation material forming a part of the first surface;
the semiconductor die immediately adjacent to the encapsulation material.

19. The semiconductor device of claim 18, wherein the first conductive pad is a ball grid array pad.

20. The semiconductor device of claim 18, wherein the first cross sectional component includes a solder bump forming a part of the first surface, such that the first conductive pad is between the solder bump and the insulator.

* * * * *